(12) United States Patent
Bolam et al.

(10) Patent No.: US 6,437,594 B1
(45) Date of Patent: Aug. 20, 2002

(54) SOI PASS GATE LEAKAGE MONITOR

(75) Inventors: Ronald J. Bolam, Fairfield; Andres Bryant; Edward J. Nowak, both of Essex Junction; Minh H. Tong, Essex, all of VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/528,350

(22) Filed: Mar. 17, 2000

(51) Int. Cl.⁷ .............................................. G01R 27/22
(52) U.S. Cl. .................... 324/765; 324/158.1; 324/763
(58) Field of Search .............................. 324/765, 158.1, 324/73.1, 763, 719; 257/48; 438/14, 18; 365/201

(56) References Cited

U.S. PATENT DOCUMENTS

| | | | |
|---|---|---|---|
| 4,860,261 A | * | 8/1989 | Kreifels et al. .............. 365/201 |
| 5,517,107 A | * | 5/1996 | Ovens et al. ................ 324/716 |
| 5,521,524 A | * | 5/1996 | Houston ....................... 324/765 |
| 5,717,340 A | * | 2/1998 | Mehrotra et al. ........... 324/73.1 |
| 5,770,881 A | | 6/1998 | Pelella et al. |
| 5,774,411 A | | 6/1998 | Hsieh et al. |
| 5,818,259 A | * | 10/1998 | Young et al. ................ 324/763 |
| 5,828,259 A | | 10/1998 | Cases et al. |

\* cited by examiner

Primary Examiner—Vinh P. Nguyen
(74) Attorney, Agent, or Firm—Mark Chadurjian; Cantor Colburn LLP

(57) ABSTRACT

A monitor for detecting pass gate leakage in a silicon on insulator device and a method for using the same is described herein. A pulse generator supplies a signal to a set of buffers connected in parallel, which pass on a signal to the source side of a series of NFETs. The plurality of NFETs are ordered by increasing channel widths. The NFETs have grounded gates, and therefore will not pass current due to field effects. Each NFET is connected to a latch, and the latches are originally set to the same state. When the signal supplied to the NFET drops from high to low, pass gate leakage will occur through the channel of each NFET. If pass gate leakage through any given NFET is sufficient, the latch will change states. The latch output signal is sent to a shift register, which can be made to output information. By incorporating the monitor on the chip, pass gate leakage tolerances and specifications can be established in-line during manufacture.

26 Claims, 2 Drawing Sheets

SOI PASS GATE LEAKAGE MONITOR

BACKGROUND OF THE INVENTION

The present invention relates generally to silicon-on-insulator (SOI) field effect transistors (FETs) and specifically to pass gate leakage in gated devices.

In SOI devices such as metal oxide semiconductor (MOS) FETs, the body of the device is disposed on an insulator rather than wafer, and hence is "floating" as compared to conventional bulk devices. This floating body leads to leakage mechanisms that do not occur in bulk devices. One such leakage mechanism that occurs in SOI FETs is referred to as pass gate leakage (PGL).

In an n-channel FET (NFET), when the FET is off and has a zero potential at the gate terminal, and the source and the drain are at the supply potential (+V or Vdd), the silicon-insulator interface will be in the accumulation mode. In accumulation mode, the body develops a positive potential after a sufficient period of time. If the source is then suddenly dropped to zero potential, the source-body junction is forward biased, which allows holes to flow to the source and electrons to flow to the body. The electrons that flow to the body (and eventually to the drain) act as a collector current for the lateral NPN bipolar device.

In addition to the collector current, the forward bias of the source-body junction temporarily causes the threshold voltage of the device to decrease, which results in increased sub-threshold current. This current, in combination with the collector current, form an undesirable drain current that can impact the correct functioning of the FET. For example, pass gate leakage reduces noise immunity by allowing unwanted signals to pass through the device. What is needed in the art is a method of monitoring pass gate leakage in SOI devices, such as NFETs, that exhibit such unwanted leakage.

BRIEF SUMMARY OF THE INVENTION

An embodiment of the present invention is a wafer processing test circuit comprising a plurality of pass gates having varying channel widths, a plurality of latches each connected to one of said pass gates, each of said latches receiving a leakage signal from its connected pass gate, an input circuit for supplying a test signal to said plurality of pass gates, said test signal having a preselected magnitude, wherein said plurality of pass gates outputs a leakage signal to its connected latch in response to said test signal, thereby causing said latches to assume one of a triggered state and an untriggered state, and storage coupled to said plurality of latches for storing one of said triggered state and untriggered state for each of said latches.

Another embodiment of the present invention is a method for testing for pass gate leakage in devices on a wafer comprising applying a test signal of a preselected magnitude to a plurality of pass gates having varying channel widths, outputting a leakage signal from each of said pass gates, receiving said leakage signals at a plurality of latches each connected to one of said pass gates, wherein said leakage signals are not all sufficient to trigger their connected latches, and storing triggered and untriggered latch states in storage coupled to said latches.

BRIEF DESCRIPTION OF THE DRAWINGS

The present invention will now be described, by way of example only, with reference to the accompanying drawings which are meant to be exemplary, not limiting, and wherein like elements are numbered alike in several Figures, in which.

DETAILED DESCRIPTION OF THE INVENTION

A pass gate leakage monitor which is able to test for pass gate leakage in-line during chip fabrication is described herein. The pass gate leakage monitor functions through the application of a test signal pulse to the source side of a device while monitoring leakage current at the drain side of the device. An output or leakage signal on the drain side of the device indicates whether or not a pass gate leakage current above a threshold value occurred. The monitor in its simplest form comprises a device for applying a test signal to pass gates, the pass gates themselves, and a device for sensing the responses of the pass gates to the test signal. Any conventional means for applying a test signal and sensing the responses can be used in the circuit.

Figure 1:
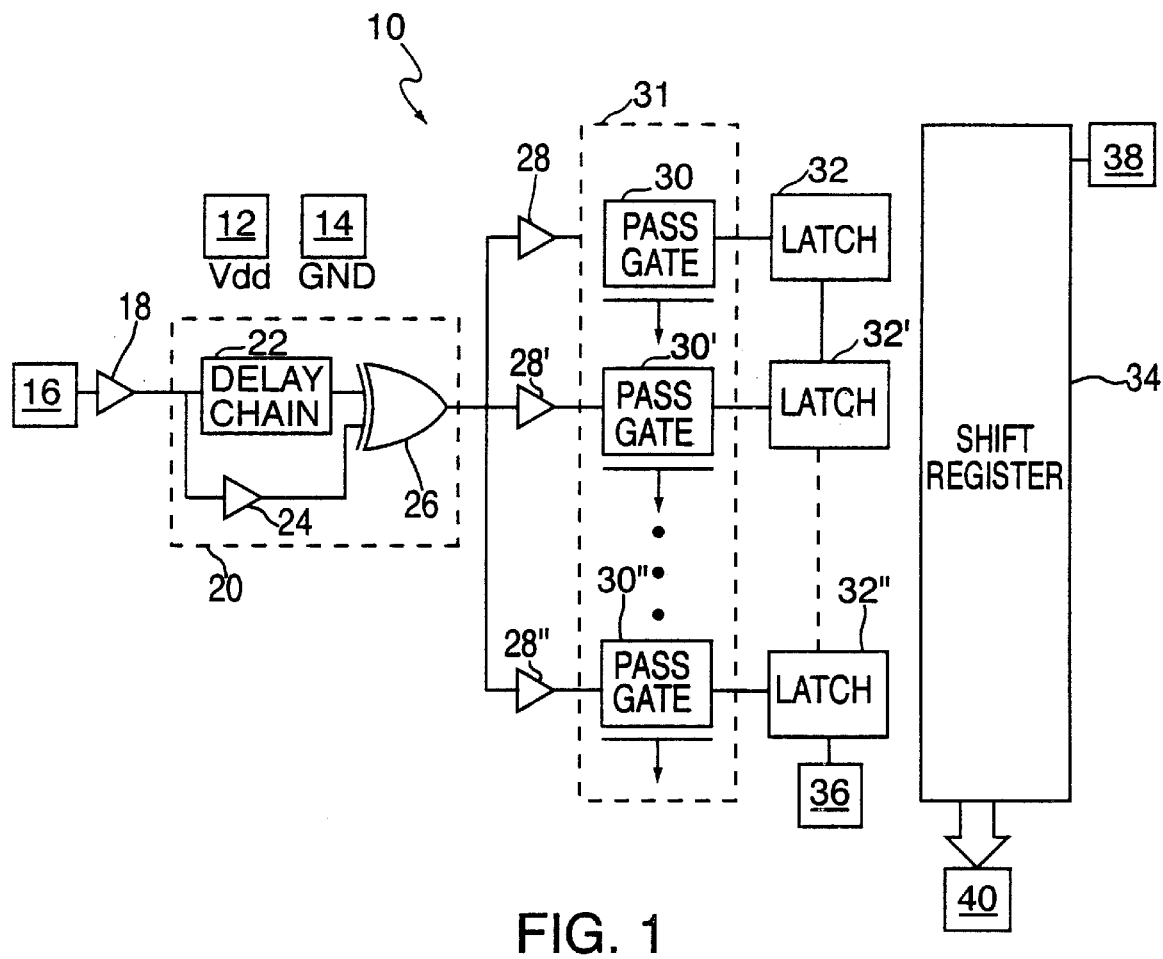
FIG. 1 is a block diagram which illustrates the circuit of one embodiment of the pass gate leakage monitor.

Referring now to FIG. 1, a block diagram of one embodiment of the pass gate leakage monitor is shown generally at 10. A voltage supply pad 12 (Vdd) and a ground pad 14 provide contact points for applying potential to the circuit.

A trigger pad 16 provides a contact point for applying voltage from the voltage supply pad 12 to the circuit. The trigger pad 16 is connected to a buffer 18, which is used to supply a clean signal to a pulse generator 20. The buffer 18 can be any buffer conventionally used for such an application. For example, the buffer 18 can be an NFET with a gate electrode connected to the trigger pad 16, the drain connected to Vdd, the source connected to the pulse generator 20, and a resistor to ground.

The pulse generator 20 applies a test signal to the pass gates, and can be any conventional pulse generator that can provide the required test signal pulse to the circuit at a predetermined magnitude. For example, as shown in FIG. 1, the pulse generator can be a parallel set of delay chains coupled to an exclusive OR gate. In this embodiment, a delay inverter chain 22 is connected in parallel with an inverter 24. The signals from the delay inverter chain 22 and the inverter 24 are fed into an exclusive OR gate 26, which creates a signal that starts low, becomes high, and then drops back to low. Since hole flow occurs rapidly, but accumulation of charge in the body occurs relatively slowly, it is preferable for the pulse generator 20 to create a test signal pulse with a sufficiently long initial low to allow for sufficient accumulation in the body of the pass gate FETs. The pulse created is sufficient to supply each of the remaining buffers (see below) with a signal surpassing the threshold voltage of the remaining buffers. The pulse can be reversed, of course, if a signal inverter/buffer is added or removed later in the circuit.

The test signal created by the pulse generator 20 is sent in parallel to multiple sets of buffers in series with pass gate NFETs. For example, the signal is sent to buffer 28 and pass gate NFET 30, buffer 28' and pass gate NFET 30', and buffer 28" and pass gate NFET 30". For clarity, only three complete sets of buffers and pass gate NFETs are shown, but any number of sets can be used, depending upon the application. The pass gate NFETs 30, 30', 30" are, in this embodiment, the device being tested for pass gate leakage, and therefore each gate is grounded. Since each of the pass gate NFETs 30, 30', 30" are grounded, any current passing through the pass gate NFETs will be due to leakage currents rather than current passing through the pass gate NFET due to a field effect produced by the gate. That is, pass gate NFETs 30, 30',30" will be "off" during testing, and will not pass any current other than leakage current.

The pass gate NFETs 30, 30', 30" can be organized in any manner within the test circuit. Preferably, the pass gate NFETs 30, 30', 30" are ordered according to channel width to produce a series of pass gate NFETs with broadening channel width. For example, pass gate NFET 30 can have a relatively narrow channel width, pass gate NFET 30' can have a channel width slightly larger than pass gate NFET 30, and so on, until pass gate NFET 30", which will have the widest channel of all of the pass gate NFETs. In this example, NFET 30 and 30" have channel widths of 30 $\mu$m and 40 $\mu$m respectively. It is preferable that at least ten pass gate and latch circuit combinations be used. However, if the process variation is known, one can design the pass gate width and the latch sensitivity to meet the needs of monitoring and therefore determine how many combinations are needed. This configuration of pass gate NFETs is preferable, since pass gate leakage is dependent upon channel width. Together, the pass gate NFETs form a graded pass gate NFET series 31 comprising pass gate NFETs of gradually increasing channel width.

Connected to each pass gate NFET is a latch which functions as a means for sensing the leakage signal produced by the pass gate NFETs. For example, latch 32 is connected to pass gate NFET 30, latch 32' is connected to pass gate NFET 30', and latch 32" is connected to pass gate NFET 30". The latches 32, 32', 32" can be any conventional switch that is capable of changing states in response to pass gate leakage in excess of a threshold value. A pad 36 is connected to the latches 32, 32', 32", and can be used to preset the latches 32, 32', 32" to a uniform initial state.

Each latch 32, 32', 32" will send a signal to a storage device such as a shift register 34. The shift register 34 can be any conventional register or storage means that can store the signal information from the latches, and then output that signal information, including, but not limited to, conventional multiplexers. A toggle pad 38 is connected to the shift register 34, and functions to initiate transfer of shift register 34 information out of the circuit through another pad 40. The toggle pad 38, shift register 34, and output pad 40 are one possible configuration for storage and output of the latch signals, and one skilled in the art will readily see that many other configurations of storage and output devices are within the scope of this invention.

Figure 2:
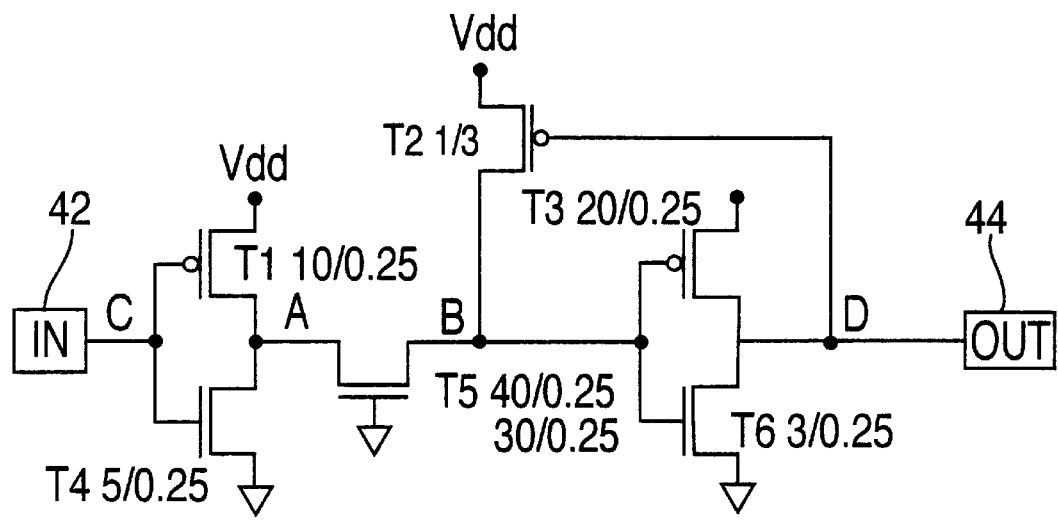
FIG. 2 is a schematic diagram of an exemplary circuit that can be used to implement the buffer-pass gate NFET-latch series shown in FIG. 1.

FIG. 2 shows one possible circuit that can be used to test for pass gate leakage in a pass gate NFET. The schematic in FIG. 2 represents a buffer, pass gate NFET, and latch combination as represented in FIG. 1 by, for example, buffer 28, pass gate NFET 30, and latch 32. The schematic can represent any or all of the buffer-NFET-latch combinations in the circuit, with all buffer-NFET-latch combinations preferably comprising the same components. Transistors T1 and T4 represent a buffer and inverter (e.g. buffer 28 in FIG. 1), transistor T5 represents the pass gate NFET that is being tested for pass gate leakage (e.g. pass gate NFET 30 in FIG. 1), and transistors T2, T3, and T6 represent a latch (e.g. latch 32 in FIG. 1). The transistors have channel width and length dimensions in microns given immediately after the transistor number. Although one embodiment is shown in FIG. 2, one skilled in the art will realize that transistor dimensions can be readily altered depending on the application. T5 will have varying channel widths, depending upon which pass gate NFET in the series 31 in FIG. 1 is represented, and what the needs of the application are. In FIG. 2, T5 is shown as, alternatively, a 40 micron pass gate NFET and a 30 micron pass gate NFET, and the test results for both in a circuit trial will be detailed below. These two widths are exemplary only, and any width NFET channel can be incorporated into the series 31 of pass gate NFETs.

The buffer/inverter comprising T1 and T4 can be, for example, an enhancement mode PFET and NFET, respectively. Together T1 and T4 form a CMOS buffer/inverter that is used in the circuit to apply or remove a potential from the source side of the T5. An input test signal 42 "IN" is received from the pulse generator 20 and delivered to the gate electrodes of T1 and T4. The source of T1 is connected to Vdd and the drain for T1 is connected to the source for T5 and the drain for T4. The source for T4 is connected to ground.

T5 is an enhancement mode pass gate NFET, and represents one of the varying width pass gate NFETs (30, 30', 30") shown in FIG. 1. The gate for T5 is grounded, and the source for T5 is connected to the drain of T1 and the drain of T4. The drain of T5 is connected to the drain of T2 and the gate electrodes of T3 and T6. As described above, only leakage current will flow through the T5 channel during operation of the circuit.

T2 is an enhancement mode PFET. The source for T2 is connected to Vdd. This transistor functions as part of the latch for the circuit. T3 is also an enhancement mode PFET, with a source connected to Vdd and a drain connected to the T2 gate electrode, the shift register 34, and the drain of T6. T6 is an enhancement mode NFET and the source for T6 is connected to ground. An output signal 44 is sent to the shift register 34 from the latch.

Figure 3:
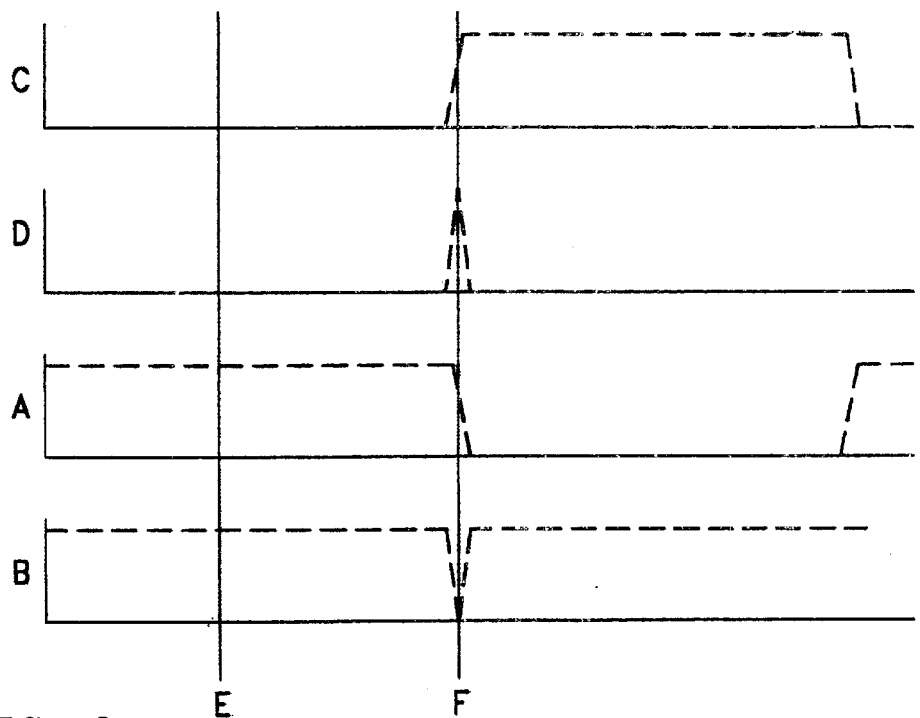
FIG. 3 is a voltage versus time graph for four points on the circuit shown in FIG. 2 for an exemplary pass gate NFET with a 30 micron channel width.

The functioning of the circuit will now be described in detail, with reference to FIGS. 3 and 4 where appropriate. FIG. 3 represents voltage-time plots of points A, B, C, and D as shown in FIG. 2 for a 30 micron wide channel pass gate NFET, and FIG. 4 represents voltage-time plots of the same points for a 40 micron wide channel pass gate NFET.

Figure 4:
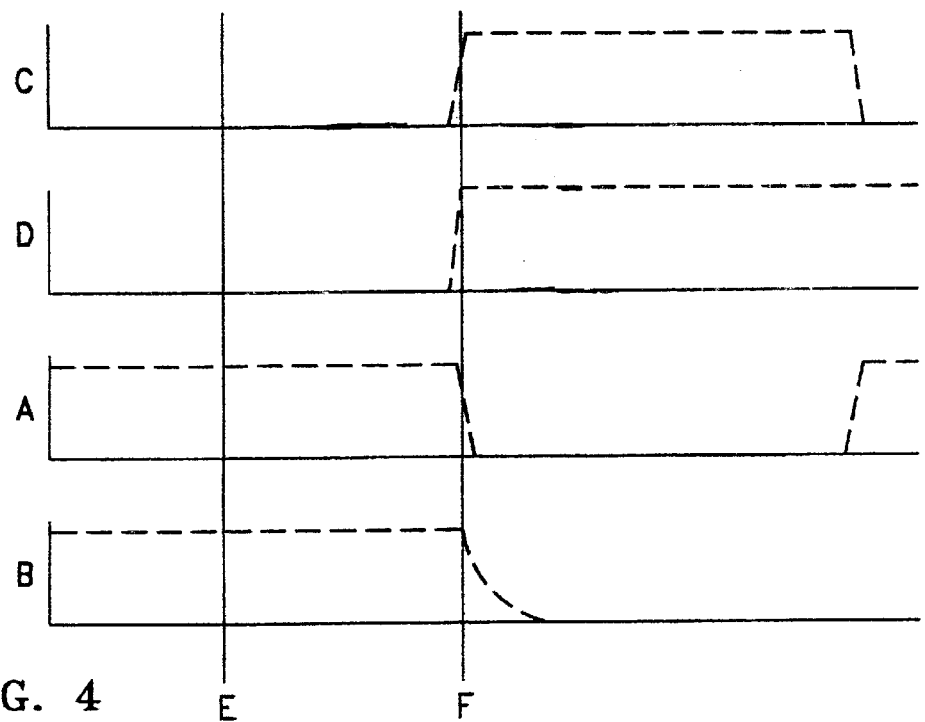
FIG. 4 is a voltage versus time graph for four points on the circuit shown in FIG. 2 for an exemplary pass gate NFET with a 40 micron channel width.

In the initial state, shown by the vertical line labeled "E" in FIGS. 3 and 4, the input test signal 42 from the pulse generator 20 is low. In FIGS. 3 and 4 this low initial input is shown in plot C. The low input signal 42 closes T1 and opens T4, thereby causing point A to go high. This inversion is represented by plot A in FIGS. 3 and 4. The source of T5, therefore has a potential of Vdd in the initial state.

In the initial state, point "D" has been set to low, thereby closing T2. Since T2 is closed, the gate electrodes of T3 and T6 are high at Vdd, and T3 is therefore open. T6, on the other hand, is closed by the high gate voltage. Since T3 is open and T6 is closed, D is grounded and thus stays low, and the latch is set with a low output signal 44. Since T2 is closed, however, the drain side—point "B"—of T5 is high at Vdd. FIGS. 3 and 4 show that B is initially high and D is initially low, and the initial state for the two different pass gate NFETs is therefore the same. In fact, the initial state of the circuit described above will generally be the same for every pass gate NFET in the circuit.

During the period when both points A and B are at high voltage, the body of the pass gate NFET, T5, will be in accumulation mode. The input signal should be held low long enough to allow for the desired accumulation. Once accumulation has reached the desired level, the pulse generator 20 changes the input test signal 42 to high. This change is represented in FIGS. 3 and 4 by point "F" on the time axis, and the change to high is seen in plot C at time F.

When the input test signal 42 changes to high, T1 opens and T4 closes. When T4 closes, point A drops to ground voltage as charge flows through T4 to ground. The change from high to low at point A is shown in FIGS. 3 and 4 in plot A at time F.

In both the 30 micron and 40 micron cases, the sudden voltage drop on the source side of T5 results in pass gate leakage through T5 and a corresponding leakage signal to the latch. The leakage current discharges through T4. As a result of the sudden drop in voltage on the source side of T5, the drain side of T5 undergoes a sudden voltage drop caused by the pass gate leakage. This voltage drop on the drain side of T5 can be seen in FIGS. 3 and 4 in plot B at time F.

In the case of the 30 micron T5, the sudden voltage drop at B causes the voltage at the gate electrodes of T3 and T6 to drop sufficiently low to partially close T3 and partially open T6. As a result, point D goes high, the output signal 44 goes high, and the gate electrode at T2 is partially opened, further lowering the potential at point B. This is depicted in plot D of FIG. 3, in which a sudden spike in voltage is seen just after time F. In this case, however, the pass gate leakage is not sufficiently large to trigger the latch, and change its state. That is, the potential at B is not reduced enough to cause T3 to close enough and T6 to open enough to result in a complete opening of T2. Consequently, as shown in plot B of FIG. 3, T2 remains closed enough to rapidly increase the voltage at B. As a result, T3 is opened, T6 is closed, and the voltage at point D, as shown in plot D of FIG. 3, returns to ground voltage. The final result is an output signal 44 to storage that remains low because the latch is untriggered.

In the 40 micron pass gate NFET, conversely, the pass gate voltage is sufficient to lower the voltage at B enough to cause the latch to trigger and change states. Specifically, the change to low at B causes T3 to close and T6 to open, which results in a change to high at point D. The change to high at D is enough to fully open T2. With T2 open, the voltage at B remains low, and T3 remains open. The latch has been triggered, the state of the latch has been changed, and the output signal 44 has been shifted from low to high. With the latch state changed, the output signal 44 will remain high, regardless of further cycling of the input signal 42, because the drain side of T5 will remain in a low state until the latch is reset. The voltage changes of the circuit for the 40 micron pass gate NFET are shown in FIG. 4. At time F the output signal in plot D changes from low to high, while the potential on the drain side of T5 goes from high to low, as shown in plot B of FIG. 4.

Although a latch that has triggered and changed states cannot be changed back to its original state by further input signals, a latch that has not changed states can do so. In other words, due to minor variances in the input signal 42 or the circuit itself, a latch that has not been changed in state during the first period of the input test signal could be triggered in a subsequent period. At some pass gate NFET width, however, the minor variations will not overcome the insufficiency of the pass gate leakage, and the latch will not be changed in state even if the input signal 42 is allowed to cycle repeatedly.

After the input signal 42 returns to its original low state, the various latches will either have been changed in state or not changed in state, and the shift register 34 will receive either a high or low signal from each latch as a result. By activating the toggle pad 38, the information in the shift register 34 can be read out through the output pad 40. The output of the shift register (e.g. the last stage of a J-K flip-flop shift register) can be measured and recorded after each pulse transition applied to the toggle pad. The data will generally be represented as a series of data bits, with each type of bit representing one of the latch states. Typically, the NFETs with very narrow channels below the threshold pass gate leakage width will all have the same latch state (low output), with some mixing of latch state as the critical channel width for pass gate leakage is reached. Thereafter, the pass gate NFETs with broader channels will generally all have a latch state opposite to that of the narrow channels (that is, a high output). The pass gate NFET channel width at which the latch output signal 44 changes states represents the threshold pass gate leakage channel width.

To retest for pass gate leakage, the latches can be reset by grounding the latches at the pad 36. When the latches are grounded in this manner, point D drops to low voltage, and T2 is closed as a result. As before, T3 is then opened and T6 is closed, and a steady state is reached wherein B is at a high potential and D is at ground. The latches will all now be in a reset state, and repeat testing of the pass gates can be performed.

The pass gate monitor described above provides a tool for monitoring pass gate leakage of SOI devices on a chip. Since no external equipment is needed to test for pass gate leakage, and since all of the required circuitry can be incorporated directly into the integrated circuits on the chip, pass gate leakage monitoring can be performed in-line. Such in-line monitoring of pass gate leakage allows for efficient pass gate leakage tolerances as well as greater quality control.

While preferred embodiments have been shown and described, various modifications and substitutions may be made thereto without departing from the spirit and scope of the invention. Accordingly, it is to be understood that the present invention has been described by way of illustration only, and such illustrations and embodiments as have been disclosed herein are not to be construed as limiting to the claims.

What is claimed is:

1. A semiconductor wafer test circuit for testing pass gate leakage, the test circuit comprising:

a plurality of pass gates having varying channel widths;

a plurality of latches, each of said plurality of latches connected to a corresponding one of said plurality of pass gates, each of said plurality of latches receiving a leakage signal from its corresponding pass gate connected thereto;

an input circuit for supplying a test signal to each of said plurality of pass gates, said test signal having a preselected magnitude;

wherein each of said plurality of pass gates outputs a leakage signal to its corresponding connected latch in response to said test signal, thereby causing said plurality of latches to assume one of a triggered state and an untriggered state; and, storage coupled to said plurality of latches for storing one of said triggered state and untriggered state for each of said plurality of latches.

2. The circuit of claim 1 wherein said storage comprises a shift register.

3. The circuit of claim 1 wherein said pass gates are NFETs.

4. The circuit of claim 1 wherein said pass gates, said latches, said input circuit, and said storage are disposed on said wafer.

5. The circuit of claim 1 wherein said latches each comprise an enhancement mode PFET and a CMOS inverter, said CMOS inverter comprising an enhancement mode PFET and an enhancement mode NFET.

6. The circuit of claim 1 wherein said plurality of pass gates comprises about 10 to about 20 pass gates.

7. The circuit of claim 1 wherein said plurality of pass gates have channel widths from about 30 to about 40 microns.

8. The circuit of claim 1 wherein said input circuit comprises a parallel set of delay chains coupled to an exclusive OR gate.

9. A method for testing for pass gate leakage in devices on a wafer comprising:

applying a test signal of a preselected magnitude to a plurality of pass gates having varying channel widths;

outputting a leakage signal from each of said pass gates;

receiving said leakage signals at a plurality of latches each connected to one of said pass gates, wherein said leakage signals are not all sufficient to trigger their connected latches; and, storing triggered and untriggered latch states in storage coupled to said latches.

10. The method of claim 9 wherein said storage comprises a shift register.

11. The method of claim 9 wherein said pass gates are NFETs.

12. The method of claim 9 wherein said pass gates, said latches, said storage, and an input circuit for generating said test signal are disposed on said wafer.

13. The method of claim 12 wherein said input circuit comprises a parallel set of delay chains coupled to an exclusive OR gate.

14. The method of claim 9 wherein said latches each comprise an enhancement mode PFET and a CMOS inverter, said CMOS inverter comprising an enhancement mode PFET and an enhancement mode NFET.

15. The method of claim 9 wherein said plurality of pass gates comprises about 10 to about 20 pass gates.

16. The method of claim 9 wherein said plurality of pass gates have channel widths from about 30 to about 40 microns.

17. A semiconductor wafer test circuit for testing pass gate leakage, the test circuit comprising:

a plurality of pass gates having a preselected range of channel widths all fabricated on a common substrate;

means for applying a test signal to said pass gates; and, means for sensing responses of said pass gates to said test signal, wherein said responses of said pass gates vary corresponding to channel widths of said pass gates.

18. The circuit of claim 17 wherein said means for sensing responses of said pass gates is a plurality of latches each connected to one of said pass gates and storage coupled to said latches.

19. The circuit of claim 18 wherein said means for applying a test signal to said pass gates is an input circuit, and said pass gates, said latches, said storage, and said input circuit are disposed on said wafer.

20. The circuit of claim 18 wherein said latches each comprise an enhancement mode PFET and a CMOS inverter, said CMOS inverter comprising an enhancement mode PFET and an enhancement mode NFET.

21. The circuit of claim 17 wherein said pass gates are NFETs.

22. The circuit of claim 17 wherein said plurality of pass gates comprises about 10 to about 20 pass gates.

23. The circuit of claim 17 wherein said plurality of pass gates have channel widths from about 30 to about 40 microns.

24. The circuit of claim 19 wherein said input circuit comprises a parallel set of delay chains coupled to an exclusive OR gate.

25. The circuit of claim 17 wherein said pass gates are ordered according to channel width.

26. The circuit of claim 17 wherein said pass gates are ordered according to channel width.

* * * * *